United States Patent
Cheng et al.

(10) Patent No.: US 8,673,788 B2
(45) Date of Patent: Mar. 18, 2014

(54) METHOD OF FORMING A LAYER ON A SEMICONDUCTOR SUBSTRATE HAVING A PLURALITY OF TRENCHES

(75) Inventors: Chung-Hsiu Cheng, Banqiao (TW);
Shih-Hao Wu, Hsinchu (TW);
Chih-Hsien Hsu, Hsinchu (TW);
Chia-Chi Chung, Hsinchu (TW);
Wei-Yueh Tseng, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 391 days.

(21) Appl. No.: 12/845,531

(22) Filed: Jul. 28, 2010

(65) Prior Publication Data
US 2012/0028468 A1    Feb. 2, 2012

(51) Int. Cl.
*H01L 21/302* (2006.01)
*H01L 21/461* (2006.01)
*C03C 25/00* (2006.01)
*C23F 1/00* (2006.01)
*B44C 1/22* (2006.01)

(52) U.S. Cl.
USPC .......... 438/719; 216/39; 216/79; 216/99

(58) Field of Classification Search
USPC ................ 216/39, 79, 99; 438/719
See application file for complete search history.

(56) References Cited

U.S. PATENT DOCUMENTS

| | | | | |
|---|---|---|---|---|
| 4,836,885 A * | 6/1989 | Breiten et al. | | 438/427 |
| 5,294,562 A * | 3/1994 | Lur et al. | | 438/427 |
| 5,663,107 A * | 9/1997 | Peschke et al. | | 438/692 |
| 6,015,755 A * | 1/2000 | Chen et al. | | 438/692 |
| 6,093,656 A * | 7/2000 | Lin | | 438/734 |
| 6,376,361 B1 * | 4/2002 | Chooi et al. | | 438/631 |
| 6,884,729 B2 * | 4/2005 | Lee et al. | | 438/704 |
| 7,005,236 B2 | 2/2006 | Cheng et al. | | |
| 7,220,362 B2 * | 5/2007 | Catabay et al. | | 216/87 |
| 2009/0161291 A1 * | 6/2009 | Kim | | 361/305 |

* cited by examiner

*Primary Examiner* — Allan Olsen
*Assistant Examiner* — Margaret D Klunk
(74) *Attorney, Agent, or Firm* — Haynes and Boone, LLP

(57) ABSTRACT

A method of fabricating a semiconductor device is illustrated. A substrate having a plurality of trenches is provided. The plurality of trenches include trenches having differing widths. A first layer is formed on the substrate including in the plurality of trenches. Forming the first layer creates an indentation in the first layer in a region overlying a trench (e.g., wide trench). A second layer is formed in the indentation. The first layer is etched while the second layer remains in the indentation. The second layer may protect the region of indentation from further reduction in thickness. In an embodiment, the first layer is polysilicon and the second layer is BARC of photoresist.

16 Claims, 6 Drawing Sheets

METHOD OF FORMING A LAYER ON A SEMICONDUCTOR SUBSTRATE HAVING A PLURALITY OF TRENCHES

BACKGROUND

Technological advances in integrated circuit (IC) materials and design have produced ICs with smaller and more complex features. With the shrinking technology nodes, integrated circuit manufacturing has realized many challenges. One such challenge is the topographical issues that arise when features of different aspect ratios are closely arranged on a substrate. For example, device designs may require forming a layer of material in a plurality of trenches having different aspect ratios. However, maintaining uniformity and/or control of the material formed in the trenches may be difficult to due to micro-loading effects. For example, an etching process has a different etch rate in different dimensions. Therefore, a wider trench may have a different etch property than a narrow trench. Thus, applying a similar process recipe can provide different results depending on the topography. This can lead to poor uniformity across the substrate. For example, despite being processed simultaneously, the thickness of a material disposed in a wide trench and an adjacent narrow trench may differ by thousands of Angstroms.

Thus, it is desirable to have an improved method of forming a layer of a semiconductor device, where the layer is formed on a substrate having a plurality of features (e.g., trenches) of varying dimensions.

DETAILED DESCRIPTION

Figure 1:
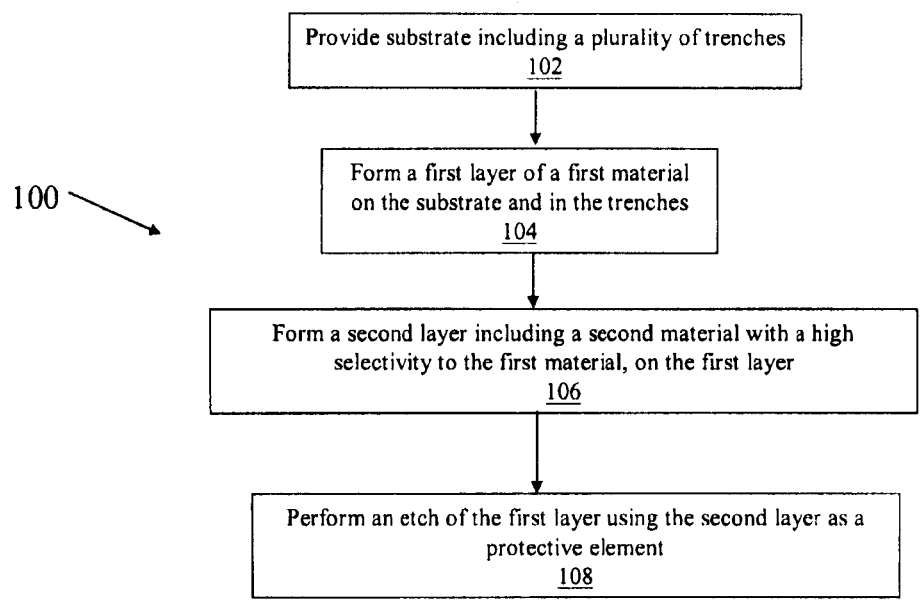
FIG. 1 is a flow chart of an embodiment of a method of forming a layer of a semiconductor device.

The present disclosure relates generally to forming a semiconductor device on a substrate and, more particularly, to a method of forming a layer of material on a substrate including trenches of varying dimensions. It is understood, however, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature on a second feature in the description that follows may include embodiments in which the first and second features are formed in direct contact, and may also include embodiments in which additional features may be formed interposing the first and second features, such that the first and second features may not be in direct contact. As an example, a feature formed on a substrate may include features formed on, above, and/or within the substrate. Furthermore, relative terms are used throughout the disclosure (e.g., wider, wide, narrow trenches). These terms are relative only and not intended to convey a specific dimension.

Referring to FIG. 1, illustrated is a flowchart of a method 100. The method 100 provides a method of forming a layer of a semiconductor device. The method 100 begins at block 102 where a substrate is provided. The substrate includes a plurality of trenches. The trenches may vary in aspect ratio, including in width and/or depth. In an embodiment, the trenches of substantially the same depth and have different width. These different widths may be described relatively as "wide" and "narrow."

The substrate is typically a semiconductor substrate. In an embodiment, the substrate is a silicon substrate (e.g., wafer) in crystalline structure. The substrate may include various doping configurations depending on design requirements (e.g., p-type substrate or n-type substrate). Other examples of the substrate include other elementary semiconductors such as germanium and diamond; a compound semiconductor such as, silicon carbide, gallium arsenide, indium arsenide, or indium phosphide; and/or other possible compositions. The substrate may optionally include an epitaxial layer (epi layer), may be strained for performance enhancement, and/or may include a silicon-on-insulator (SOI) structure. Furthermore, the substrate may include one or more features formed thereon including, for example, isolation features, implanted regions, gate structures, interconnect structures, and/or a variety of other typical semiconductor device features or portions thereof.

The trenches may be formed in the substrate, for example, the trenches may be openings formed by etching silicon of the silicon substrate. In other embodiments, the trenches may be formed in one or more layers formed on the substrate itself.

The method 100 then continues to block 104 where a first layer is formed on the substrate. The first layer includes a first material. In an embodiment, the first material includes polysilicon, as described below with reference to the method of FIG. 2. However, other materials are within the scope of the disclosure and are selected as required by a design of the resulting semiconductor device. The first layer is formed on the substrate including in and on the plurality of trenches. The first layer may be non-planar. For example, the first layer may be decreased in thickness over one or more of the plurality of trenches. The region of decreased thickness is described herein as an indentation. In an embodiment, the first layer has an indentation over one or more trenches that are described relatively as "wide."

The method 100 then proceeds to block 106 where a second layer is formed on the first layer. The second layer includes a second material, which has a high etch selectivity to the first material. The second layer is disposed on the indentation region of the first layer. In an embodiment, the second material includes a conformal coating film such as, for example, photoresist or a bottom antireflective coating (BARC) (see the example of FIG. 2). However, other materials are within the scope of the disclosure to be selected as providing high etch selectivity with the first material. The second layer may be a conformal coating such that it covers the first layer with substantially uniform thickness and is subsequently removed from regions of the first layer. In particular, the conformal coating may be removed from regions other than those of the first layer which have a decreased thickness (e.g., the indentation(s)).

The method 100 then proceeds to block 108 where an etch is performed on the first layer. The etch may be a wet etch and/or dry etch process that has a high selectivity between the second layer and the first layer (i.e., the second layer remains substantially unetched). During the etch of the first layer, the second layer acts as a protective element (or masking element) for a portion of the second layer (e.g., masks a portion of the second layer such that it is not etched at the same rate). The protective element protects (e.g., masks) regions of the first layer that have a decreased thickness (e.g., indentation(s)). The protective element of the second layer may allow for a region of the first layer having decreased thickness (e.g., indentation) to not be further reduced in thickness. Thus, after the etching of the first layer, the first layer may have improved planarity.

One or more additional processes may be performed on the substrate including additional etching of the first and/or second layers. Example processes are described below with reference to the embodiment of FIG. 2. In an embodiment, the first layer is selectively etched while the second material remains in the indentation region. Thus, the second material protects the region of the first layer having a decreased thickness. Therefore, a more planar surface of the first layer is provided after the etching process(es).

Figure 2:
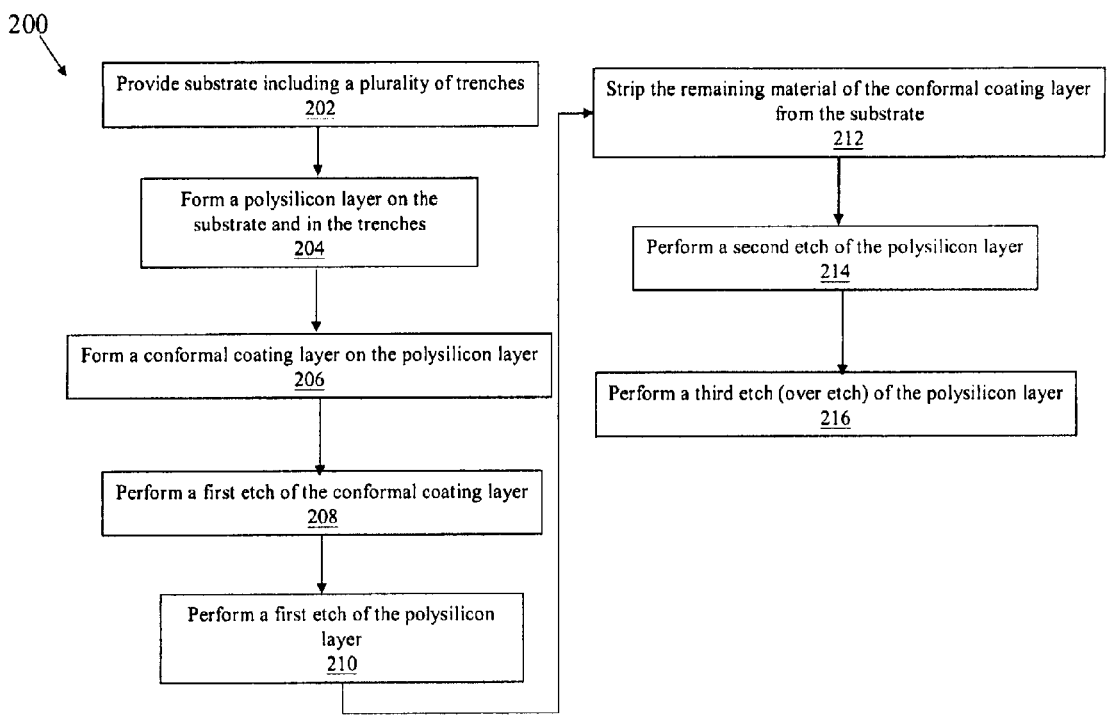
FIG. 2 is a flow chart illustrating an embodiment of the method of FIG. 1.
Figure 3:
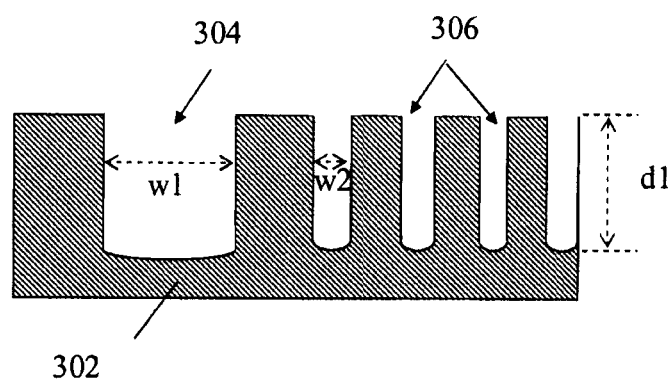
FIGS. 3, 4, 5, 6, 7, 8, 9 and 10 are cross-sectional views of a semiconductor device corresponding to steps of the method of FIG. 2.
Figure 4:
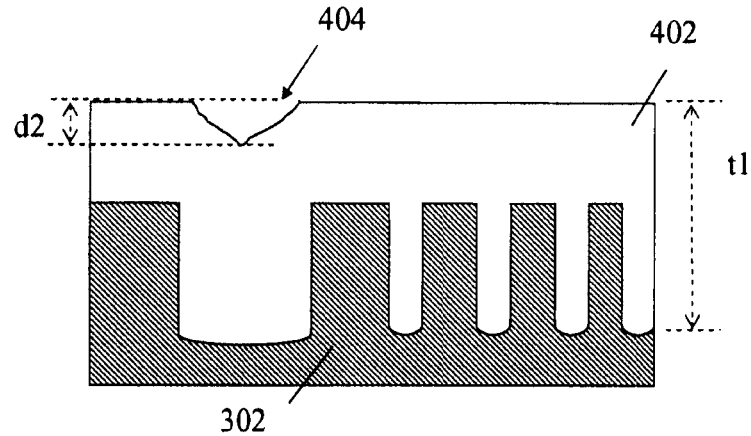

Referring now to FIG. 2, illustrated is a method 200 which provides a method of forming a layer on a semiconductor substrate having a plurality of trenches. The method 200 provides an embodiment of the method 100. FIGS. 3, 4, 5, 6, 7, 8, 9 and 10 illustrate cross-sectional views of an embodiment of a semiconductor device at various stages of fabrication corresponding to the method 200 of FIG. 2.

The method 200 begins at block 202 where a substrate including a plurality of trenches is provided. In an embodiment, the plurality of trenches vary in width and have substantially the same depth. The plurality of trenches may be shallow and/or deep trenches. Referring to the example of FIG. 3, a substrate 302 is illustrated. A plurality of trenches including a wide trench 304 and a plurality of narrow trenches 306 is disposed on the substrate 302.

The substrate 302 includes a semiconductor substrate. In an embodiment, the substrate 302 is a silicon substrate (e.g., wafer) in crystalline structure. The substrate 302 may include various doping configurations depending on design requirements (e.g., p-type substrate, n-type substrate, or epitaxial substrate). Other examples of the substrate 302 include other elementary semiconductors such as germanium and diamond; a compound semiconductor such as, silicon carbide, gallium arsenide, indium arsenide, or indium phosphide; and/or other possible compositions. The substrate 302 may optionally include an epitaxial layer (epi layer), may be strained for performance enhancement, and/or may include a silicon-on-insulator (SOI) structure. Furthermore, the substrate 302 may include one or more features formed thereon including, for example, isolation features, implanted regions, gate structures, interconnect structures, and/or a variety of other typical semiconductor device features or portions thereof.

The wide trench 304 has a width w1. The narrow trenches 306 each have a width w2. The trenches 304 and 306 have a depth d1. In an embodiment, the depth d1 is between approximately 1 μm and approximately 10 μm. In a further embodiment, the depth d1 is approximately 2 μm. (It is noted that the trenches 304 and 306 may have substantially the same depth d1, however in other embodiments the trench depth may differ.) In an embodiment, the width w1 may be between approximately 0.5 μm and approximately 3 μm. In a further embodiment, the width w1 may be approximately 2 μm. In an embodiment, the width w2 may be between approximately 0.1 μm and approximately 3 μm. In a further embodiment, the width w2 may be approximately 0.4 μm. In an embodiment, the width w1 may be approximately 5 times greater than the width w2. The trenches 304 and 306 may be formed using processes such as patterning the trench openings on the substrate using suitable photolithography processes and etching the substrate in the defined openings.

The method 200 then proceeds to block 204 where a polysilicon layer is formed on the substrate, including in and on the trenches. The polysilicon layer may be formed using low-low-pressure chemical vapor deposition (LPCVD), plasma-enhanced chemical vapor deposition (PE-CVD) and/or other suitable methods. In an embodiment, the polysilicon layer is doped. Referring to the example of FIG. 4, a polysilicon layer 402 is formed on the substrate 302. The polysilicon layer 402 includes an indentation 404. The indentation 404 includes a region of the polysilicon layer 402 having a decreased thickness. The indentation 404 has a depth d2. In an embodiment, the depth d2 is between approximately 0.2 μm and approximately 10 μm. In a further embodiment, the depth d2 is approximately 0.9 μm. The indentation 404 is formed above the wide trench 304. In an embodiment, the indentation 404 is a naturally occurring outcome of a deposition/growth of the polysilicon layer and not purposefully formed (e.g., is not formed in a separate process step). The polysilicon layer 402 has a thickness t1. In an embodiment, thickness t1 is between approximately 5 kA and 30 kA. In a further embodiment, the polysilicon layer 402 is approximately 15 kA in thickness t1.

Figure 5:
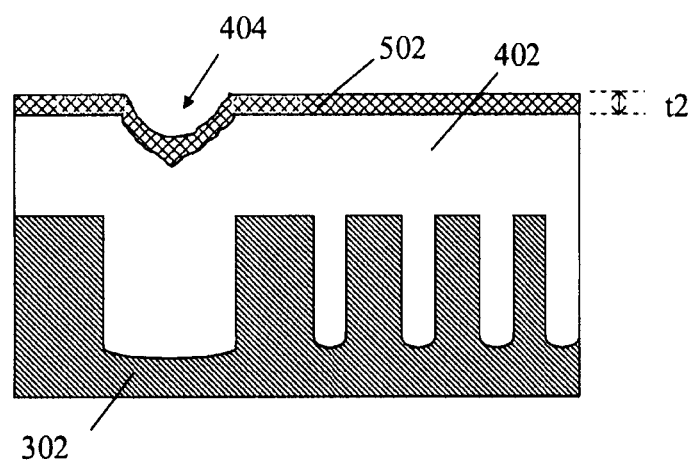
Figure 6:
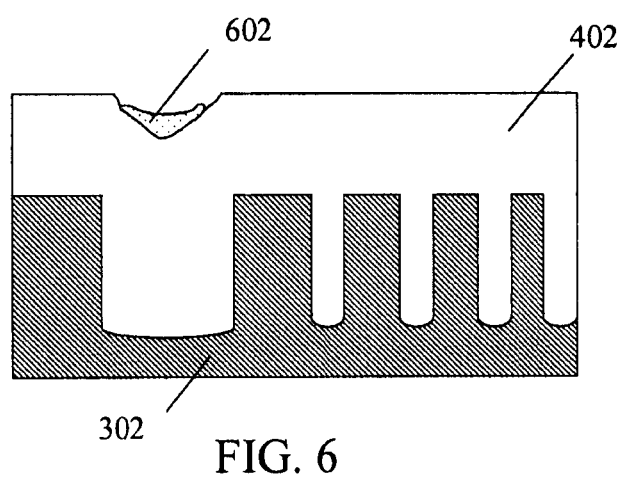

The method 200 then proceeds to block 206 where a conformal coating film is formed on the polysilicon layer. The conformal coating layer may include photoresist or bottom antireflective coating (BARC) material. The conformal coating layer has a high etch selectivity to the polysilicon layer. In an embodiment, the conformal coating includes an organic material. The conformal coating layer may be formed using spin-on coating, rinse processes, bake processes, and/or other suitable methods. Referring to the example of FIG. 5, a layer 502 is formed on the substrate 302. The layer 502 has a substantially uniform thickness t2. In an embodiment, the thickness t2 is between approximately 1000 Angstroms (A) and approximately 2000 A. In a further embodiment, the thickness t2 is approximately 1500 A. As illustrated by FIG. 5, the layer 502 is disposed in the indentation 404. The layer 502 may partially or completely fill the indentation 404. In an embodiment, the layer 502 is a BARC layer. In an embodiment, the layer 502 is photoresist.

The method 200 then proceeds to block 208 where a first etch of the conformal coating layer is performed. The etch may be a dry etch and/or wet etch that provides a high etch selectivity to the polysilicon layer (i.e., the polysilicon layer is substantially not etched). In an embodiment, the etching includes a dry etch including chlorine and/or oxygen etchants. In an embodiment, the etch parameters include a pressure of between approximately 4 and 80 mT, a source power and bias power of between approximately 100 and 400 Ws, and 0 and 400 Wb respectively, and etchants of $Cl_2/O_2/HBr/N_2$, however numerous other embodiments are possible. An example etch selectivity provides a conformal coating (e.g., BARC) etch rate of approximately 2000-3000 Angstroms/minute and a polysilicon etch rate of approximately 0 Angstroms/minute (i.e., negligible). Referring to the example of FIG. 6, the layer 502 (see FIG. 5) has been etched such that the conformal coating material only remains in the indentation 404, denoted as material 602. The material 602 may completely or partially fill the indentation 404.

The method 200 then proceeds to block 210 where an etch of the polysilicon layer is performed. The etch may be a dry etch (e.g., plasma etc) and/or wet etch that provides a high etch selectivity to the conformal coating layer (i.e., the BARC/PR layer is substantially not etched). In an embodiment, the etch includes a plasma etch including etchants of chlorine, hydrogen bromide, and/or oxygen. The etch parameters include a pressure of between approximately 4 and 80 mT, a source power and bias power of between approximately 100 and 400 Ws, and 0 and 400 Wb respectively, and etchants of $SF_6/CF_4/Cl_2/O_2/HBr$, however numerous other embodiments are possible. The amount of polysilicon etched may be determined based on the indentation depth (e.g., indentation 404). In an embodiment, between approximately 1 kA and approximately 7 kA of polysilicon is etched. Referring to the example of FIG. 7, the polysilicon layer 402 (FIG. 6) has been etched-back such that it has a thickness t3 denoted as a polysilicon layer 702. The thickness t3 is less than t1, described above with reference to FIG. 4. In an embodiment, t3 is between approximately 1000 A and approximately 7000 A less than the thickness t1. The material 602 is disposed on the indentation 404 (including during the etching of the polysilicon layer). The material 602 protects the indentation 404 from the etch process, thereby controlling the loss of polysilicon on the region overlying the wider trench and the indentation 404.

The amount of polysilicon removed in the etchback process of block 210 may be determined based on the resulting thickness of polysilicon desired in the trenches (e.g., in the wide trench). The more the polysilicon layer is etched back, the greater relative amount of polysilicon that will remain in the wider trench(es). In other words, the greater the difference between t3 and t1, the greater the thickness t4 will be relative to the thickness t5 (see FIG. 10). If the polysilicon layer is etched back to a lesser amount, less polysilicon will remain in the wide trench.

The method 200 then proceeds to block 212 where the conformal coating layer (e.g., remaining material after the etch of block 208) is stripped (e.g., flushed) from the substrate. In an embodiment, none of conformal coating layer remains on the substrate. In an embodiment, the remaining material of the conformal coating layer is stripped using a plasma etch having chlorine, oxygen etchants, HBr, and/or nitrogen. An exemplary stripping process includes parameters of a pressure of between approximately 4 and 80 mT, a source and bias power between approximately 100 and 400 Ws, and 0 and 400 Wb, respectively, and an etchants $Cl_2/O_2/HBr/N_2$, however numerous other embodiments are possible. Referring to the example of FIG. 8, the remaining material of the conformal coating (e.g., material 602) has been stripped from the substrate leaving a surface 802 of polysilicon 702. The surface 802 has an improved planarity in comparison with that of the as-deposited polysilicon layer 402 (see FIG. 4). A indentation 804 remains on the polysilicon layer 702. The indentation 804 has a depth d3, which is less than the depth d2. In an embodiment, the depth d3 is between approximately 0.1 µm and approximately 2 µm. In other embodiments, the surface 802 of the polysilicon layer 702 may be substantially planar.

The method 200 then proceeds to block 214 where a subsequent etch of the polysilicon layer is performed. In an embodiment, the etch includes a plasma etch including etchants of chlorine, hydrogen bromide, and/or oxygen. The etch parameters include a pressure of between approximately 4 and 80 mT, a source power and bias power of between approximately 100 and 400 Ws, and 0 and 400 Wb respectively, and etchants of $SF_6/CF_4/Cl_2/O_2/HBr$, however numerous other embodiments are possible. In an embodiment, the etch is an etch back process controlled by end-point mode. The etch end-point may be determined using the substrate 302 (e.g., silicon) as an etch stop. Referring to the example of FIG. 9, the polysilicon has been etched to form polysilicon layer 902, which fills the trenches 304 and 306.

The method 200 then proceeds to block 216 where a subsequent etch process is performed on the polysilicon. The etch process may be an over-etch step. The over-etch controls the depth of poly remaining in the trenches, which may be determined by the design of the semiconductor device. In an embodiment, block 214 and 216 may be combined. Referring to the example of FIG. 10, the polysilicon has been over-etched such that the polysilicon 1002 remains in the trenches 304 and 306. The polysilicon 1002 has a thickness t4 and t5. In an embodiment, t4 is substantially equal to t5. In an embodiment, the thicknesses t4 and/or t5 are between approximately 1000 A and approximately 8000 A in thickness. In a further embodiment, the thicknesses t4 and/or t5 are approximately 4000 A.

In an embodiment of the method 200, the etching processes of blocks 208, 210, 212, 214, and/or 216 may be performed in the same tool and/or same chamber. For example, the processes of blocks 208, 210, 212, 214, and/or 216 may be performed in the same high density plasma etch tool. One example of a commercially available tool is the LAM TCP 9400 manufactured by Lam Research Corporation or DPS manufactured by Applied Materials. However, other poly etch systems are known in the art and within the scope of this disclosure.

Figure 8:
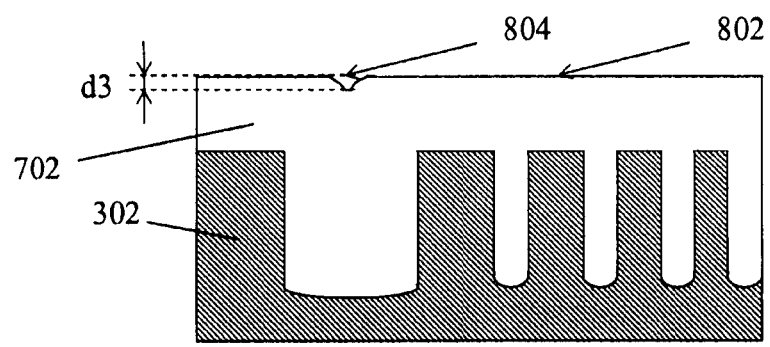
Figure 7:
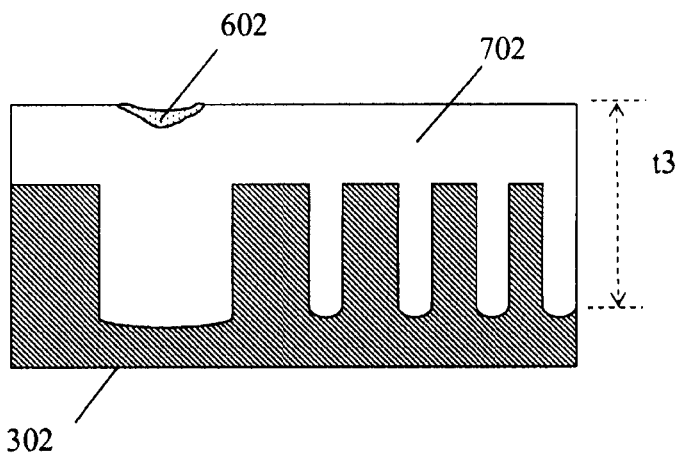
Figure 9:
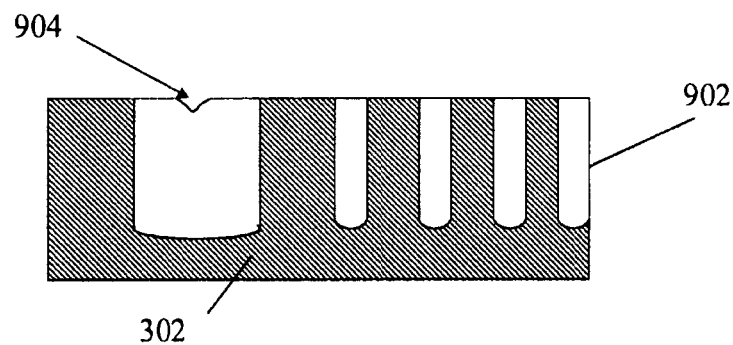
Figure 10:
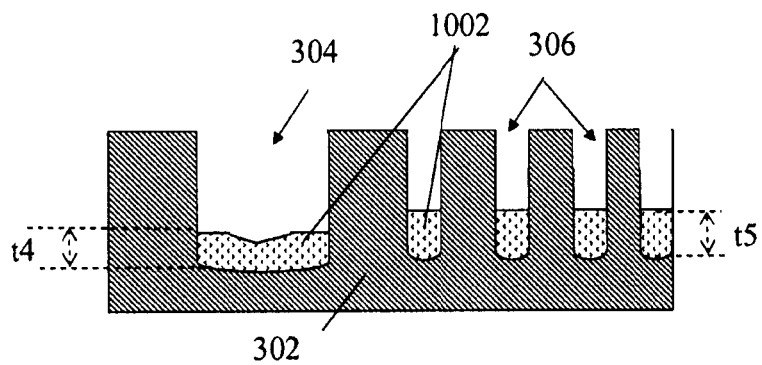

In an alternative embodiment, after the etch-back process of the polysilicon layer (block 210) the conformal coating layer (e.g., BARC, photoresist) may be removed (block 212) and a subsequent layer may be formed on the substrate. For example, additional polysilicon may be formed on the etched back polysilicon layer (e.g., polysilicon layer 702 as illustrated in FIG. 8). This may allow for formation of a polysilicon layer on the substrate overlying a plurality of trenches, which has an improved planarity.

The method 200 may be used to fabricate a device or an intermediate device during processing of an integrated circuit, or portion thereof, that may comprise memory cells and/or other logic circuits, passive components such as resistors, capacitors, and inductors, and active components such as P-channel field effect transistors (PFET), N-channel FET (NFET), metal-oxide semiconductor field effect transistors (MOSFET), complementary metal-oxide semiconductor (CMOS) transistors, bipolar transistors, high voltage transistors, high frequency transistors, other memory cells, and combinations thereof.

Thus, methods are described that allow for filling of a plurality of varying width trenches on a substrate with greater control and/or uniformity. A material with a etch selectivity (e.g., BARC) is used to protect an indentation region of the target material (e.g., polysilicon) during one or more etch processes. Therefore, the same thickness (or height) of a layer may be formed in a plurality of trenches (e.g., wide and narrow). In some embodiments, a layer overlying a plurality of trenches, which has a surface with improved planarity may be formed.

Though described herein as providing for greater control and/or uniformity of material on and in a plurality of trenches. Various other embodiments may be provided which compensate for thickness variations in layers overlying other features of a semiconductor substrate which provide a varying topology and thus, create a different etch process rate due to microloading effects.

In one embodiment, a method of fabricating a semiconductor device is provided. In the method, a substrate is provided that includes a first trench and a second trench. The first trench has a greater width than the second trench. A first layer is formed on the substrate including in the first trench and the second trench. Forming the first layer forms an indentation in the first layer in a region overlying the first trench. A second layer is formed in the indentation. The first layer is etched while the second layer remains in the indentation. In an embodiment, the second layer protects the first layer from etching in the region of decreased thickness such that an improved planarity (e.g., reduction in the indentation) can be realized. In an embodiment, the first layer is polysilicon. In an embodiment, the second layer is BARC. However, other embodiments are possible such that a high etch selectivity between the first and second layers are provided. In an embodiment, the second layer is stripped from the substrate after the first layer is etched. Further processing of the first layer may then be performed.

In another embodiment, a method is also described which includes providing a semiconductor substrate having a wide trench and a narrow trench. A polysilicon layer is formed on the semiconductor substrate including in the wide trench and the narrow trench. When forming the polysilicon layer, an indentation is formed in the polysilicon layer overlying the wide trench. A BARC layer is formed in the indentation. The polysilicon layer is then etched back while the BARC layer is in the indentation. In an embodiment, the BARC layer is subsequently stripped from the substrate. In a further embodiment, after the BARC is stripped, a second layer of polysilicon is formed on the etched back polysilicon layer. In yet another embodiment, a second etch process is performed on the etch-backed layer of polysilicon after the BARC layer is stripped from the substrate.

In another embodiment, a method of semiconductor fabrication is described which includes providing a semiconductor substrate. A layer of polysilicon is formed on the substrate. A layer of organic material is formed on the substrate overlying the layer of polysilicon. The layer of polysilicon is etched while using the organic material as a protective element for a first region of the layer of polysilicon. In an embodiment, the first region is a region which overlies a wide trench formed on the substrate. In a further embodiment, the first region has smaller thickness of polysilicon.

While the preceding description shows and describes one or more embodiments, it will be understood by those skilled in the art that various changes in form and detail may be made therein without departing from the spirit and scope of the present disclosure. Therefore, the claims should be interpreted in a broad manner, consistent with the present disclosure.

What is claimed is:

1. A method of fabricating a semiconductor device, comprising:
   providing a substrate, wherein the substrate includes a first trench having a first width and a second trench having a second width, wherein the first width is greater than the second width;
   forming a first layer of polysilicon on the substrate including in the first trench and the second trench, wherein the forming the first layer forms an indentation in the first layer in a region overlying the first trench;
   forming a second layer conformally on the first layer to form a conformal second layer, wherein the conformal second layer extends over the first trench and the second trench, and wherein the second layer is photoresist;
   dry etching the conformal second layer such that it is disposed only in the indentation; and
   after etching the conformal second layer, etching the first layer, wherein the etched second layer remains in the indentation during the etching of the first layer, and wherein the etching reduces a depth of the indentation by reducing a thickness of the first layer.

2. The method of claim 1, further comprising:
   stripping the second layer from the substrate after the etching of the first layer.

3. The method of claim 2, further comprising:
   after the stripping of the second layer, performing a second etch of the first layer.

4. The method of claim 1, wherein the indentation has a depth prior to etching the first layer of approximately 0.9 μm.

5. The method of claim 1, wherein the etching the first layer includes removing between approximately 4000 Angstroms and 5000 Angstroms of material.

6. The method of claim 1, wherein the dry etching has a selectivity to the first layer.

7. The method of claim 1, wherein the second layer includes an organic material.

8. A method, comprising:
   providing a semiconductor substrate having a wide trench and a narrow trench;
   forming a polysilicon layer on the semiconductor substrate including in the wide trench and the narrow trench, wherein the forming the polysilicon layer includes forming an indentation in the polysilicon layer overlying the wide trench;
   forming a first portion of material in the indentation, wherein the first portion of material is photoresist and wherein the forming the first portion of material includes forming a conformal layer of the material and dry etching the conformal layer to remove a first region of the conformal layer of the material, wherein the first region overlies the narrow trench and the substrate between the narrow trench and the wide trench; and
   etching back the polysilicon layer while a portion of the first portion of material is disposed in the indentation, wherein the etching back reduces a depth of the indentation.

9. The method of claim 8, wherein the first portion of material is approximately 1500 Angstroms in thickness.

10. The method of claim 8, wherein the etching back polysilicon layer has a more planar surface than the surface of the polysilicon layer prior to the etching back.

11. The method of claim 8, further comprising:
    stripping the first portion of material from the semiconductor substrate after etching back the polysilicon.

12. The method of claim 11, further comprising:
    depositing a second layer of polysilicon on the etched back polysilicon layer, after the first portion of material is stripped from the semiconductor substrate.

13. The method of claim 11, further comprising:
    performing a second etch process on the etched back layer of polysilicon after the first portion of material is stripped from the semiconductor substrate.

14. The method of claim 13, wherein the second etch process provides substantially the same thickness of polysilicon in the wide trench as the narrow trench.

15. The method of claim 8, wherein the dry etching includes at least one of a chlorine etchant and an oxygen etchant.

16. A method of semiconductor fabrication, comprising:
    providing a semiconductor substrate;
    etching a first plurality of trenches and a second plurality of trenches in the semiconductor substrate, wherein each of the first plurality of trenches is wider than each of the second plurality of trenches;
    forming a layer of polysilicon on the semiconductor substrate and in the first and second plurality of trenches, wherein the layer of polysilicon has an indentation overlying each of the first plurality of trenches;

forming a conformal layer of photoresist on the semiconductor substrate overlying the layer of polysilicon, wherein the conformal layer of photoresist overlies the first plurality of trenches and the second plurality of trenches;

dry etching the conformal layer of photoresist such that it is disposed only in the indentations; and etching the layer of polysilicon while the layer of photoresist is disposed in the indentations such that the indentations are reduced in depth.

\* \* \* \* \*